US00H002177H

(19) United States
(12) Statutory Invention Registration
Sauer et al.
(10) Reg. No.: US H2177 H
(43) Published: Jan. 2, 2007

(54) CANCELLATION OF RINGING IN MAGNETIC RESONANCE UTILIZING A COMPOSITE PULSE

(75) Inventors: Karen L. Sauer, Alexandria, VA (US); Christopher A. Klug, Alexandria, VA (US); Allen Garroway, Davidsonville, MD (US); Joel B. Miller, Cheverly, MD (US)

(73) Assignee: The United States of America, as represented by the Secretary of the Navy, Washington, DC (US)

(21) Appl. No.: 10/637,079

(22) Filed: Aug. 8, 2003

(65) Prior Publication Data

US 2005/0030029 A1 Feb. 10, 2005

(51) Int. Cl.
*G01V 3/00* (2006.01)

(52) U.S. Cl. ..... 324/318

(58) Field of Classification Search ..... 324/300, 324/303, 307, 309, 318, 322
See application file for complete search history.

(56) References Cited

U.S. PATENT DOCUMENTS

| | | | | |
|---|---|---|---|---|
| 4,339,716 | A | 7/1982 | Young | |
| 4,438,400 | A | 3/1984 | Patt | |
| 4,680,545 | A | 7/1987 | Gray et al. | |
| 4,710,718 | A | 12/1987 | Shaka | |
| 5,206,592 | A | 4/1993 | Buess et al. | |
| 5,233,300 | A | 8/1993 | Buess et al. | |
| 5,608,321 | A | 3/1997 | Garroway et al. | |
| 5,804,967 | A | 9/1998 | Miller et al. | |
| 5,986,455 | A | 11/1999 | Magnuson | |
| 6,104,190 | A | 8/2000 | Buess et al. | |
| 6,127,824 | A * | 10/2000 | Sydney Smith et al. | 324/300 |
| 6,194,898 | B1 | 2/2001 | Magnuson et al. | |
| 6,208,136 | B1 | 3/2001 | Smith et al. | |
| 6,291,994 | B1 | 9/2001 | Kim et al. | |
| 6,392,408 | B1 | 5/2002 | Barrall et al. | |
| 6,407,548 | B1 | 6/2002 | Dietz | |
| 6,411,208 | B1 | 6/2002 | Buess et al. | |
| 6,541,969 | B1 * | 4/2003 | Sigal et al. | 324/303 |
| 6,566,873 | B1 * | 5/2003 | Smith et al. | 324/300 |
| 6,570,381 | B1 * | 5/2003 | Speier et al. | 324/303 |
| 6,577,128 | B1 * | 6/2003 | Smith et al. | 324/309 |
| 2001/0035751 | A1 | 11/2001 | Heaton | |
| 2002/0093335 | A1 | 7/2002 | Miller et al. | |

* cited by examiner

*Primary Examiner*—Dan Pihulic
(74) *Attorney, Agent, or Firm*—John Karasek; Steven Hunnius

(57) ABSTRACT

A magnetic resonance detection apparatus is provided that is not susceptible to acoustic ringing, and a method is provided for eliminating or canceling acoustic ringing from a detected magnetic resonance signal. Specifically, a composite pulse is utilized that allows for both efficient reduction of acoustic ringing signals and the detection of true NQR signals. The composite pulse can be used in any of the common NQR pulse sequences currently utilized simply via substitution of the original single pulses with the composite pulse. Furthermore, although a preferred application involves the spin-1 nucleus $^{14}N$ and NQR, the composite pulse will be useful for the NQR of other nuclei such as $^{35}CI$ and $^{39}K$ and in NMR applications and involving half-integer quadrupolar nuclei and spin-½ nuclei. In addition, coil ringdown and piezoelectric ringing are also substantially reduced.

24 Claims, 4 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

CANCELLATION OF RINGING IN MAGNETIC RESONANCE UTILIZING A COMPOSITE PULSE

BACKGROUND OF THE INVENTION

The invention relates generally to an apparatus and method for cancellation of ringing in magnetic resonance. More specifically, the invention relates to an apparatus and method for cancellation of ringing in nuclear quadrupole resonance (NQR) utilizing a composite pulse.

It is known that NQR can be an effective means of detecting materials containing quadrupolar nuclei (such as $^{14}N$, $^{35,37}Cl$, etc.) that might be concealed in luggage, mail, small cargo or on a person. The detection of nitrogenous or chorine-containing explosives or narcotics utilizing NQR is of particular interest in luggage and passenger screening operations, in which a large quantity of materials or number of persons must be scanned in an efficient and non-invasive manner. As an example, consider luggage scanning where an object to be scanned is typically placed inside a large inductive coil that is part of a tuned resonance circuit. High power radio-frequency (RF) pulses are then applied to the circuit leading to an oscillating magnetic field inside the coil. The magnetic field excites the NQR signal which is subsequently detected as oscillating magnetic field via the same coil.

Unfortunately, the RF pulses utilized in typical NQR detection sequences will induce an acoustic ringing in certain circumstances. Although there are several causes and associated descriptions of acoustic ringing, one major effect is caused by the presence of a metallic material containing permanent magnetic moments within the coil. The applied oscillating magnetic field interacts with the magnetic moments, causing temporary rearrangements in the relative orientation of the magnetic moments. The rearrangement of the magnetic moments can lead to an actual change in the physical dimensions of the object—a phenomenon commonly known at the magnetostrictive effect. Following the RF pulses, the relaxation of the permanent moments leads to an acoustic ringing signal which is detected along with a true NQR signal from the nuclear spins of interest. In some situations, the acoustic ringing signal can be several orders of magnitude larger than the true NQR signal, making observation of the true NQR signal difficult if not impossible. Failure to cancel the acoustic ringing can cause an increased false alarm rate, i.e., an increased number of instances in which a detection threshold is reached due to the acoustic ringing signal instead of the underlying true NQR signal.

A current approach for reducing effects due to acoustic ringing involves a combination of two specific pulse sequences known as PAPS (phase-alternated pulse sequence) and NPAPS (non-phase-alternated pulse sequence), which involve a string of pulses, in between which signal is acquired. This technique, which is described in U.S. Pat. No. 5,365,171 issued to Buess et al. and entitled "Removing the Effects of Acoustic Ringing and Reducing Temperature Effects in the Detection of Explosives by NQR", the contents of which are herein incorporated by reference, makes use of the fact that the signal of interest has a different phase relationship to the applied RF pulses than the acoustic ringing signal in the two sequences. Combining the results from each sequence allows the suppression of the acoustic ringing signal.

The success of the PAPS and NPAPS approach, however, relies on the acoustic ringing decaying to zero between the applied pulses and leads to limitations in the pulse separation. Furthermore, the ability to observe the final signal is strongly dependent on the relaxation properties of the material under investigation and, in unfavorable cases, no true nuclear signal is observable even in the absence of acoustic ringing.

In view of the above, it would be desirable to provide a detection apparatus that was not susceptible to acoustic ringing and a method of eliminating or canceling acoustic ringing from a detected nuclear resonance signal.

SUMMARY OF THE INVENTION

A magnetic resonance detection apparatus is provided that is not susceptible to acoustic ringing, and a method is provided for eliminating or canceling acoustic ringing from a detected magnetic resonance signal. Specifically, a composite pulse is utilized that allows for both efficient reduction of acoustic ringing signals and the detection of true NQR signals. The composite pulse can be used in any of the common NQR pulse sequences currently utilized simply via substitution of the original single pulses with the composite pulse. Furthermore, although a preferred application involves the spin-1 nucleus $^{14}N$ and NQR, the composite pulse will be useful for the NQR of other nuclei such as $^{35}Cl$ and $^{39}K$ and in NMR applications and involving half-integer quadrupolar nuclei and spin-½ nuclei. In addition, coil ringdown and piezoelectric ringing are also substantially reduced.

In a preferred embodiment, the detection apparatus includes a radio frequency source, a pulse generator mechanism coupled to the radio frequency source, wherein the pulse generator mechanism generates a radio frequency composite pulse consisting essentially of two or more sub-pulses of different phase, a coil coupled to receive the radio frequency composite pulse from the pulse generator mechanism, a detector coupled to the coil, wherein the detector detects a nuclear resonance signal received from the coil that includes a true signal component and a ringing signal component, and a processor coupled to the detector, wherein the processor identifies the true signal component within the nuclear resonance signal. The processor identifies the true signal component based on the fact that the phases of each of the sub-pulses of the composite pulse, a phase of the true signal component and a phase of the ringing signal component are different.

As one example, the phase of the first subpulse is designated as 0 and the phase of the second sub-pulse with respect to the first sub-pulse is designated as x, such that the composite pulse is designated as (0, x), wherein x is equal to 45°. The pulse generator mechanism generates a sequence of composite pulses, wherein the sequence of composite pulses includes (0, x), (0, -x+180), (0, x-180), (0, -x). The processor sums detected nuclear resonance return signals corresponding to each of the composite pulses with weighting factors −1, +1, −1 and +1, respectively, to identify the true signal component, which—in a preferred application—is a nuclear quadrupole resonance signal.

The pulse generator mechanism preferably includes a pulse programmer and radio frequency gate and a radio frequency power amplifier. The pulse generator mechanism is coupled to the coil via a coupling network that is also used to couple the detector to the coil.

An alarm mechanism may also be provided, wherein the alarm mechanism is activated by the processor when the true signal component exceeds a designated threshold value.

Other advantages and features of the invention will become apparent to those skilled in the art based on the following detailed description of the preferred embodiments.

BRIEF DESCRIPTION OF THE DRAWINGS

With the above as background, the invention will now be described in greater detail with reference to the preferred embodiments thereof and the accompanying drawings, wherein.

DETAILED DESCRIPTION OF THE PREFERRED EMBODIMENTS

In many magnetic resonance experiments, transient signals associated with coil ringdown, piezoelectric ringing and acoustic ringing completely dominate, making detection of the true signal from the nuclei of interest difficult if not impossible. Coil ringdown is directly related to the energy stored within the coil and has a time constant proportional to the probe Q. Piezoelectric ringing arises for situations where the object in the coil is a piezoelectric material and is caused by the oscillating electric dipoles excited by the electrical component of the RF field. Since for magnetic resonance it is the magnetic rather than the electrical component of the RF field that is essential, in principle the piezoelectric ringing can be reduced by proper coil design and electrostatic shielding of the coil. In practice, however, piezoelectric ringing can still be significant in a well-designed system. Acoustic ringing is a significant problem in the application of NQR to the detection of explosives or narcotics as described above, as luggage may contain ferromagnetic metals with permanent magnetic moments which lead to large magnetostrictive acoustic ringing signals.

Most magnetic resonance detection apparatus use a tuned LC circuit that includes a coil in which a sample is placed and to which RF pulses are applied for signal excitation. The resulting signal is usually detected via the same circuit, although sometimes a separate circuit is used for detection and there are other indirect detection methods. Each RF pulse results in coil ringdown and in addition can produce an acoustic ringing signal in addition to the desired true signal from the nuclear spins. In situations where the phase of the applied RF pulse, the true signal and the acoustic ringing signal (and the coil ringdown) is the same, e.g. the detection of the free induction decay following a single pulse, it is impossible to separate the true signal from the background.

In contrast, it has been recognized by the present inventors that a composite pulse can be utilized in place of a single pulse to eliminate acoustic ringing. The principle underlying the design and use of composite pulse to replace a single pulse is to create a situation where the phases of the applied RF composite pulse, the true signal, and the ringing signal are different. The difference in phases allows for processing to separate the true signal from the ringing signal (acoustic ringing, ringdown and piezoelectric ringing). The present invention allows both the magnetic and electrical acoustic ringing effects to be removed while retaining the true signal, thereby allowing the inspection of previously inaccessible objects by an NQR detection apparatus.

Figure 1:
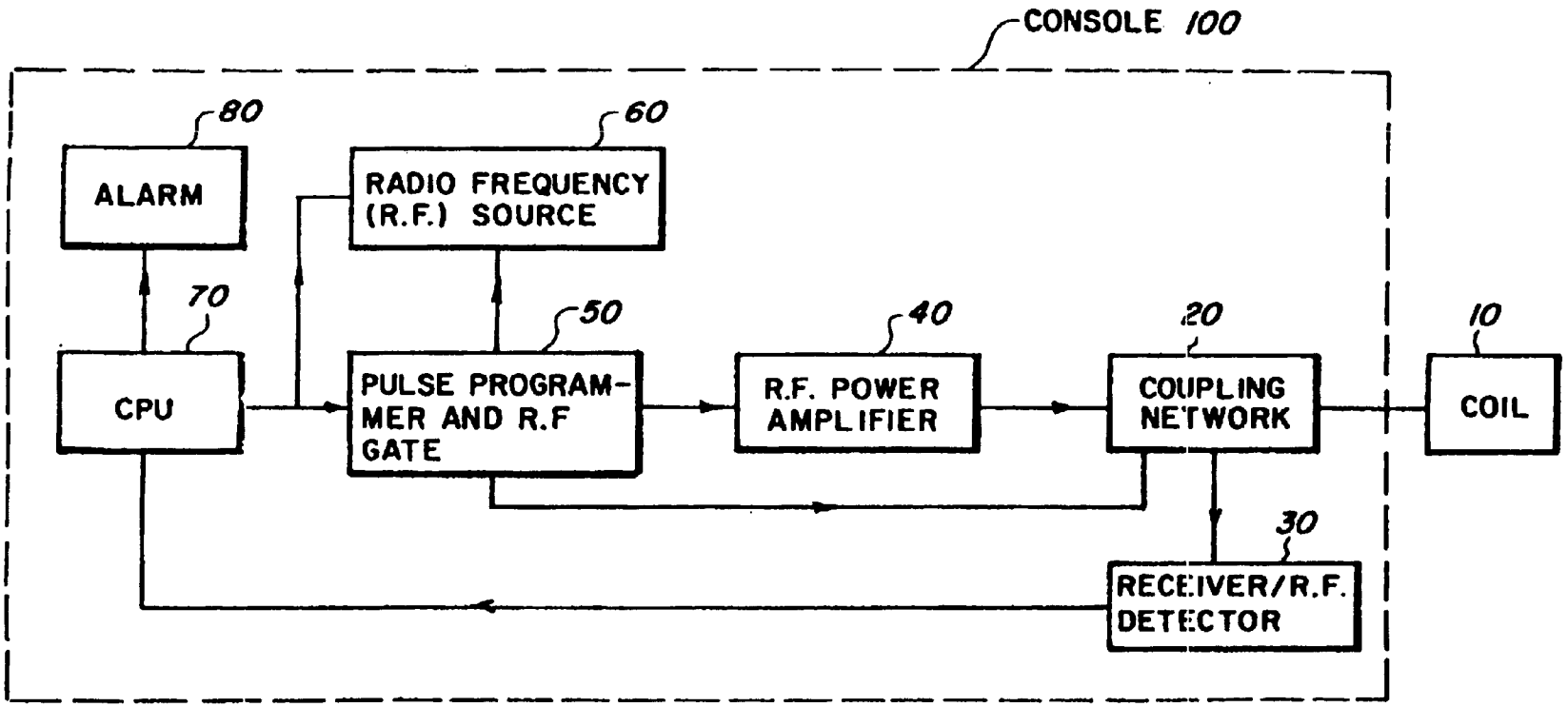
FIG. 1 is a schematic block diagram of a nuclear resonance detection apparatus in accordance with the present invention.

An NQR detection apparatus in accordance with the present invention will now be described with reference to FIG. 1. As shown in FIG. 1, the NQR detection apparatus includes a radio frequency source 60, a pulse programmer and RF gate 50 and an RF power amplifier 40, which are provided to generate RF pulses having a predetermined frequency to be applied to a coil 10. A coupling network 20 conveys the RF pulses from the radio frequency source 60, the pulse programmer and RF gate 50 and the RF power amplifier 40 to the coil 10. The coupling network 20 also conducts a return signal to the receiver/RF detector 30 from the coil 10 after a sample of interest has been irradiated. A central processing unit (CPU) 70 controls the radio frequency source 60 and the pulse programmer and RF gate 50 to a predetermined frequency which coincides with or is near to NQR frequency of the material to be detected within a sample of interest (for example $^{14}N$, $^{35,37}Cl$, etc. for explosives or narcotics within luggage). The CPU 70 processes the detected return signal received from the receiver/RF detector 30 to identify the true NQR signal, as will be described in greater detail below, and then compares the true NQR signal to a threshold value. If the true NQR signal exceeds the threshold value, the CPU 70 activates an alarm 80 indicating that the material of interest has been detected. If desired, the coupling network 20, the receiver/RF detector 30, the RF power amplifier 40, the pulse programmer and RF gate 50, the radio frequency source 60, the CPU 70 and the alarm 80 may be contained within a console 100 with only the coil being located outside of the console 100.

It will be understood that the basic structural configuration of the detection apparatus illustrated in FIG. 1 is well known. U.S. Pat. No. 5,233,300 issued to Buess et al. and entitled "Detection of Explosive and Narcotics by Low Power Large Sample Volume Nuclear Quadrupole Resonance (NQR), the contents of which are incorporated herein by reference, discloses a detection apparatus with the same structural configuration. In the present case, however, the CPU 70 controls the pulse programmer and RF gate 50 and/or the radio frequency source 60 to generate a composite pulse, wherein the composite pulse includes two or more substantially continuous sub-pulses each having a different phase.

Figure 2:
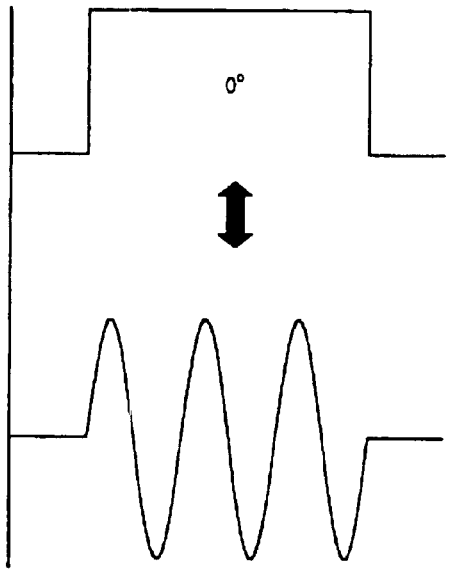
FIG. 2 illustrates a conventional single RF pulse utilized in a conventional nuclear resonance detection apparatus.
Figure 3:
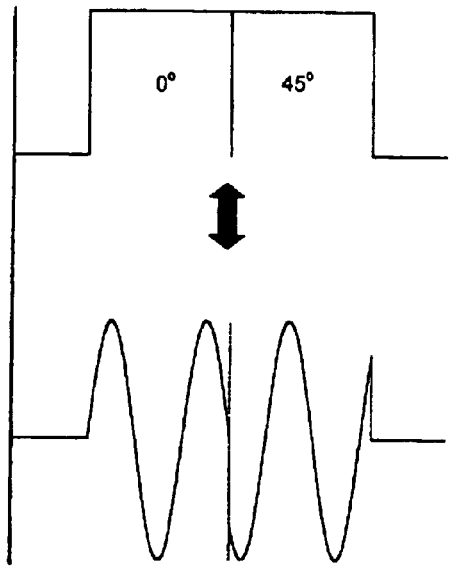
FIG. 3 illustrates a composite pulse in accordance with the present invention, wherein the composite pulse includes two sub-pulses.

The composite pulse of the present invention can directly replace a conventional single RF pulse. For the purposes of this discussion, a "single RF pulse" will refer to a pulse as illustrated in FIG. 2, wherein a corresponding RF signal is maintained at a constant phase. In contrast, a "composite pulse" will refer to a pulse as illustrated in FIG. 3, wherein each sub-pulse corresponds to a different phase. The relative phases of the two sub-pulses in each composite pulse can range anywhere between 0 and 359 degrees. If the phase of the first sub-pulse is designated as 0°, the composite pulse can be written as (0°, x°) where x is the phase of the second sub-pulse relative to the first sub-pulse.

An experiment was conducted to observe a free induction decay (FID) following a conventional single RF pulse as compared with a composite pulse of the present invention. The experiment involved obtaining four FID's, each corresponding to one of a series of composite pulses: (0°, x°) (0°, −x+180°), (0°, x-180°), (0°, −x°). As an example, composite pulses (0°, 45°), (0°, 135°), (0°, −135°), (0°, −45°) were utilized. The four FID's resulting from the four composite pulses were then summed with the weighting factors of −1, +1, −1 and +1, respectively. It should be noted that the order of the four FID's is important when the time between the FID's becomes comparable to the decay time of the acoustic ringing. By combining the data in this way, the "ringing" associated with each pulse is cancelled while true nuclear magnetic resonance signal remains ("ringing" is defined as to include acoustic ringing, coil ringdown, and piezoelectric ringing). Table I illustrates the composite pulses utilized for the four FID's, the weighting factors, and the signs of the ringing associated with the sub-pulses.

TABLE I

| FID | Composite pulse for x = 45° | Acquire weighting | Sign of "ringing" associated with i) 1st pulse | ii) 2nd pulse |
|---|---|---|---|---|
| 1 | (0°, 45°) | −1 | + | + |
| 2 | (0°, 135°) | +1 | + | + |
| 3 | (0°, −135°) | −1 | + | − |
| 4 | (0°, −45°) | +1 | + | − |

Further phase cycling can be incorporated by varying the phase of the initial pulse of the two-pulse composite pulse and maintaining the relative phase differences. The lengths of the two pulses are variable and do not affect the cancellation of the acoustic ringing signal. However, optimal detection of the true NQR signal was found both experimentally (for $^{14}N$) and theoretically to occur for pulse lengths corresponding to $\pi/2$ and $\pi$ for the first and second pulse respectively. A $\pi/2$ pulse is defined as a pulse which gives the maximum signal in the reference experiment and a $\pi$ pulse is twice as long. In the NQR of $^{4}N$, this gave 80% of the signal observed in the reference experiment with a $\pi/2$ pulse.

Figure 4:
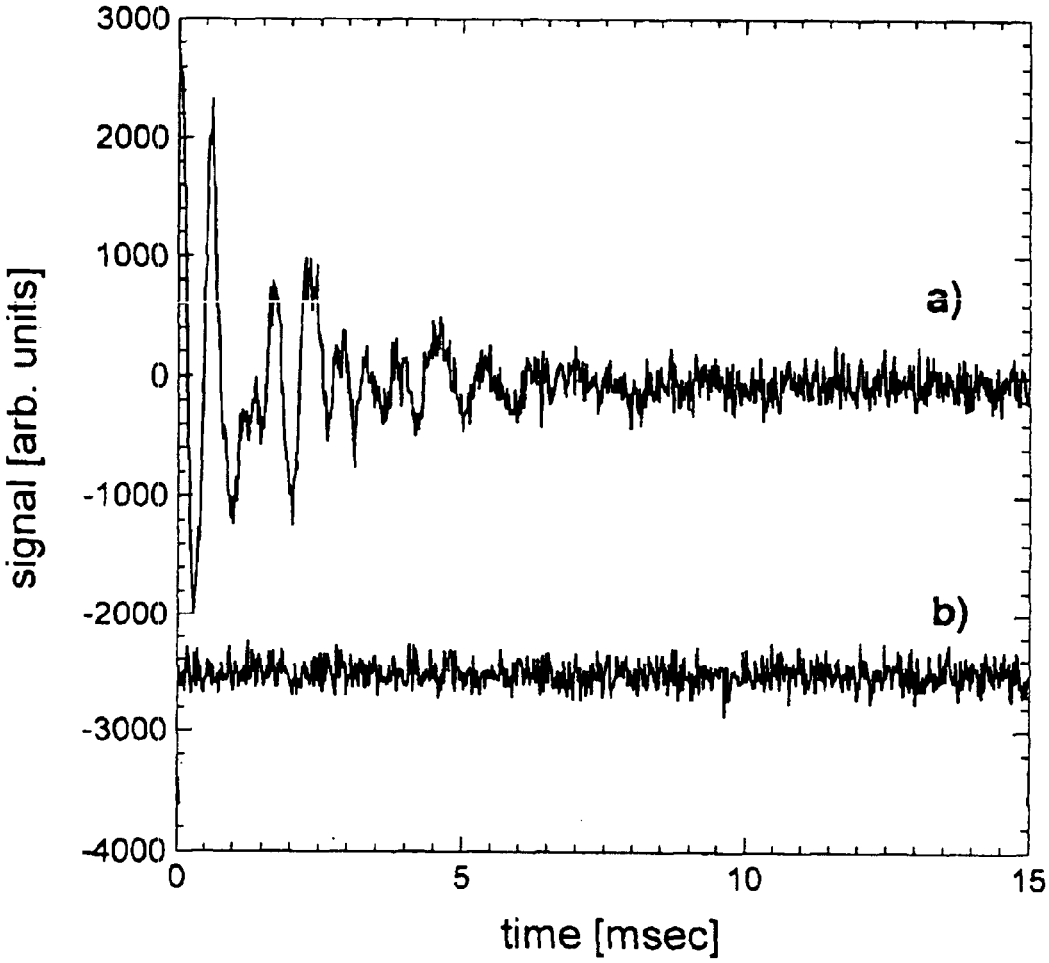
FIG. 4 is a graph illustrating an experimental demonstration that shows the cancellation of a ringing signal component of a detected return signal.

FIG. 4 illustrates an experimental demonstration of the effectiveness of composite pulses for the removal of acoustic ringing signal due to the presence of magnetized paper clips within a coil. A reference point using a conventional signal pulse is shown in Trace (a). A signal obtained using the two sub-pulse composite pulses following the phase and summation method described above is shown in Trace (b). As shown in FIG. 4, the ringing is effectively eliminated or canceled by the use of the composite pulses.

Figure 5:
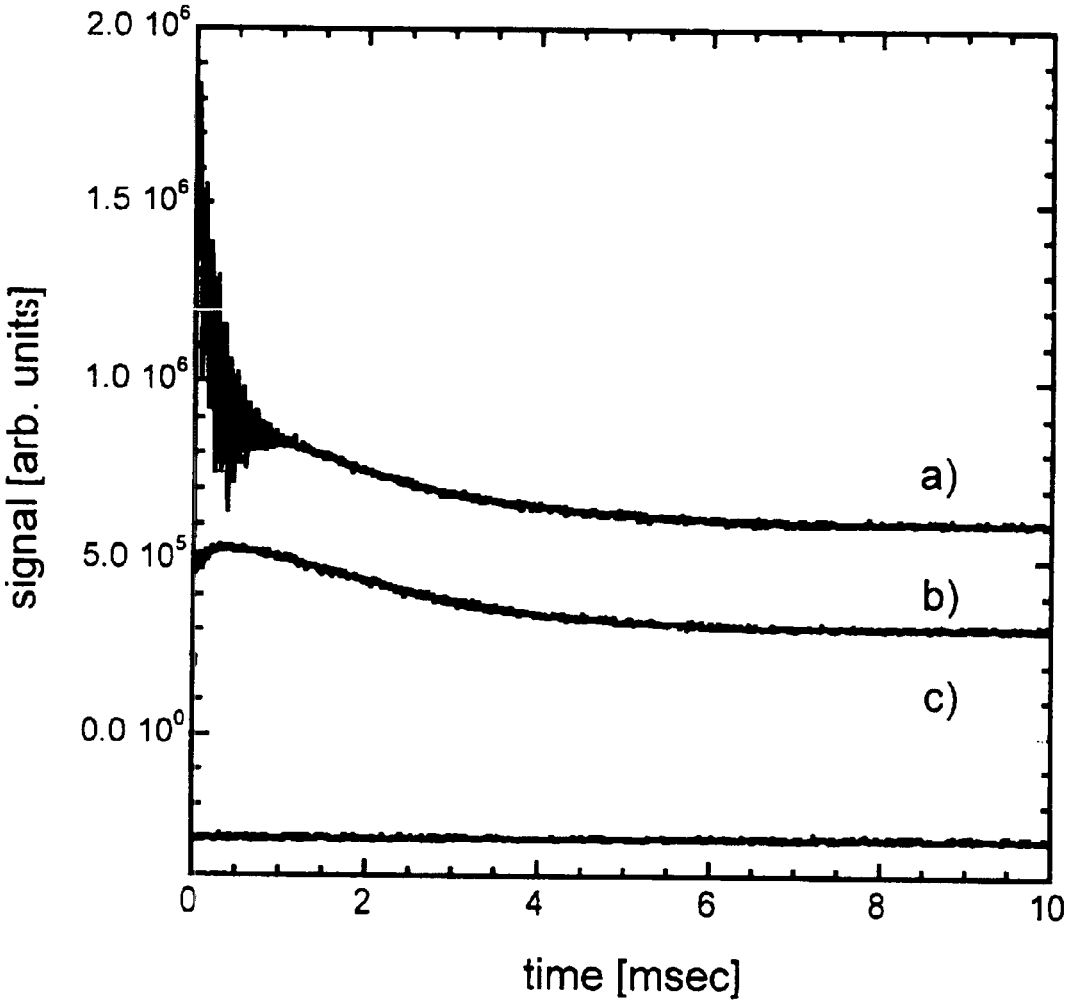
FIG. 5 is a graph illustrating an experimental demonstration that shows the separation of a true NQR signal component from a detected return signal.

FIG. 5 illustrates a further experimental demonstration of the effectiveness of composite pulses for removal of acoustic ringing due to the presence of piezoelectric quartz rock within a coil and the retention of NQR signal from $NaNO_2$. Trace (a) illustrates a signal obtained at a frequency of 1.04 MHz with conventional single pulses. Trace (b) illustrates the signal obtained using a two sub-pulse composite pulse as described above. Trace (c) illustrates a signal obtained with an empty coil. As illustrated in FIG. 5, the true NQR signal shown in Trace (b) is clearly identified.

A qualitative understanding can be obtained via a vector model. If each composite pulse is considered as leading to a net rotation about some new axis which is not along either x, y, −x, or −y, then the four FID's can be viewed as resulting from initial magnetization vectors which are similarly not necessarily along the x, y, −x, or −y axes. Ultimately, the signal which remains after combining the four FID's is only one component, or a fraction thereof, of the initial magnetization, i.e. the x-component, where x is defined as along the 0° axis, for the phase list above.

The composite pulse sequence described above has also been found to be useful in stochastic NQR excitation where in general the pulse lengths are short compared to $\pi/2$. Stochastic resonance techniques in NMR were first proposed by R. R. Ernst. See, J. Phys. Chem., 45 (1966) 3845-3861. More recently this approach has been applied to NQR. See, D. B. Zax et al., J. Phys. Chem. 100, (1996) 1483–1487).

One of the "disadvantages" of NQR is that for a powder sample, unlike NMR, a pulse whose length is three times that of a $\pi/2$ pulse (i.e. a $3\pi/2$ pulse) does not result in a signal equal in magnitude but opposite in sign to that for a $\pi/2$ pulse. The resulting NQR signal for the $3\pi/2$ pulse, though inverted, is typically considerably smaller than that for a $\pi/2$ pulse. Whereas many NMR experiments make use of this relationship to develop pulse sequences for the removal of acoustic ringing which do not involve composite pulses, such approaches are less successful in NQR in terms of the final true signal size obtained. Implicit in these alternate approaches is the assumption that the ringing response is linear in the area of the applied RF pulse (i.e. proportional to the length of the pulse multiplied by the magnetic field it produces within the sample coil). An advantage of the composite pulse approaches described above is that the only requirement is that the acoustic ringing from a composite pulse is the sum of the acoustic ringing from each individual pulse within the composite pulse string.

With respect to the relative size of the "ringing" signals compared to the true NQR and NMR signals, it should be noted that, in those situations where the "ringing" signal is considerably larger than the true signals, a large dynamic range in the receiver is required so that both the "ringing" signals and true signals are accurately measured during each step of the process.

The ability to cancel the acoustic ringing signals will allow the inspection of objects which heretofore have been inaccessible to NQR measurements. The additional cancellation of coil ringdown may lead to further applications in a wide range of magnetic resonance experiments where there is a need to observe the signal as close to the excitation pulse as possible. This technique will potentially lead to significant improvements in the detectability of certain explosives and narcotics via NQR.

A significant advantage of the composite pulses described above is that they can be incorporated into almost any existing pulse sequence, simply by replacing the original single pulses with composite pulses. Indeed, composite pulses can be used in combination with PAPS/NPAPS to allow small pulse separations. Furthermore, due to the cancellation of coil ringdown effects when composite pulses are used, this may allow the observation of true signals for situations where previously the signal was unobservable.

The invention has been described with reference to certain preferred embodiments thereof. It will be understood, however, that modifications and variations are possible within the scope of the appended claims. For example, the invention has potential applications in both nuclear magnetic resonance and nuclear quadrupole resonance experiments where significant acoustic ringing and/or coil ringdown is present, and is not limited to the specific applications discussed herein.

What is claimed is:

1. A detection apparatus comprising:

means for generating an RF composite pulse, wherein said RF composite pulse consists essentially of two or more sub-pulses of different phase;

means for applying the RF composite pulse to a test sample;

means for detecting a nuclear resonance return signal in response to the application of the RF composite pulse to the test sample, wherein the detected nuclear resonance return signal includes a true signal component and a ringing signal component; and processing means for processing the detected nuclear resonance return signal to identify the true signal component;

wherein the phases of each of the sub-pulses of the composite pulse, a phase of the true signal component and a phase of the ringing signal component are different.

2. A detection apparatus as claimed in claim 1, wherein the phase of the first sub-pulse is 0 and the phase of the second sub-pulse with respect to the first sub-pulse is x, such that the composite pulse is designated as (0, x).

3. A detection apparatus as claimed in claim 2, wherein x=45°.

4. A detection apparatus as claimed in claim 1, wherein the means for generating an RF composite pulse generates a sequence of composite pulses.

5. A detection apparatus as claimed in claim 4, wherein the sequence of composite pulses includes (0, x), (0, −x+180), (0, x−180), (0, −x).

6. A detection apparatus as claimed in claim 5, wherein the processing means sums detected nuclear resonance return signals corresponding to each of the composite pulses with weighting factors −1, +1, −1 and +1, respectively.

7. A detection apparatus as claimed in claim 1, wherein the true signal component is a nuclear quadrupole resonance signal.

8. A method comprising:

generating an RF composite pulse, wherein said RF composite pulse consists essentially of two or more sub-pulses of different phase;

applying the RF composite pulse to a test sample;

detecting a nuclear resonance return signal in response to the application of the RF composite pulse to the test sample, wherein the detected nuclear resonance return signal includes a true signal component and a ringing signal component; and processing the detected nuclear resonance return signal to identify the true signal component;

wherein the phases of each of the sub-pulses of the composite pulse, a phase of the true signal component and a phase of the ringing signal component are different.

9. A method as claimed in claim 8, wherein the phase of the first sub-pulse is 0 and the phase of the second sub-pulse with respect to the first sub-pulse is x, such that the composite pulse is designated as (0, x).

10. A method as claimed in claim 9, wherein x=45°.

11. A method as claimed in claim 8, wherein generating an RF composite pulse includes generating a sequence of composite pulses.

12. A method as claimed in claim 11, wherein the sequence of composite pulses includes (0, x), (0, −x+180), (0, x−180), (0, -x).

13. A method as claimed in claim 12, wherein processing includes summing detected nuclear resonance return signals corresponding to each of the composite pulses with weighting factors −1, +1, −1 and +1, respectively.

14. A method as claimed in claim 8, wherein the true signal component is a nuclear quadrupole resonance signal.

15. A detection apparatus comprising:

a radio frequency source;

a pulse generator mechanism coupled to the radio frequency source, wherein the pulse generator mechanism generates a radio frequency composite pulse consisting essentially of two or more sub-pulses of different phase;

a coil coupled to receive the radio frequency composite pulse from the pulse generator mechanism;

a detector coupled to the coil, wherein the detector detects a nuclear resonance signal received from the coil that includes a true signal component and a ringing signal component; and a processor coupled to the detector, wherein the processor identifies the true signal component within the nuclear resonance signal;

wherein the phases of each of the sub-pulses of the composite pulse, a phase of the true signal component and a phase of the ringing signal component are different.

16. A detection apparatus as claimed in claim 15, wherein the phase of the first sub-pulse is 0 and the phase of the second sub-pulse with respect to the first sub-pulse is x, such that the composite pulse is designated as (0, x).

17. A detection apparatus as claimed in claim 16, wherein x=45°.

18. A detection apparatus as claimed in claim 15, wherein the pulse generator mechanism generates a sequence of composite pulses.

19. A detection apparatus as claimed in claim 18, wherein the sequence of composite pulses includes (0, x), (0, −x+180), (0, x−180), (0, −x).

20. A detection apparatus as claimed in claim 19, wherein the processor sums detected nuclear resonance return signals corresponding to each of the composite pulses with weighting factors −1, +1, −1 and +1, respectively.

21. A detection apparatus as claimed in claim 15 wherein the true signal component is a nuclear quadrupole resonance signal.

22. A detection apparatus as claimed in claim 15, wherein the pulse generator mechanism includes a pulse programmer and radio frequency gate and a radio frequency power amplifier.

23. A detection apparatus as claimed in claim 15, wherein the pulse generator mechanism is coupled to the coil via a coupling network, and wherein the detector is coupled to the coil via the coupling network.

24. A detection apparatus as claimed in claim 15, further comprising an alarm mechanism, wherein the alarm mechanism is activated by the processor with the true signal component exceeds a threshold value.

* * * * *